United States Patent [19]

Takagi

[11] 4,227,961
[45] Oct. 14, 1980

[54] PROCESS FOR FORMING A SINGLE-CRYSTAL FILM
[75] Inventor: Toshinori Takagi, Nagaokakyo, Japan
[73] Assignee: Futaba Denshi Kogyo K.K., Chiba, Japan
[21] Appl. No.: 695,646
[22] Filed: Jun. 14, 1976
[30] Foreign Application Priority Data Jun. 27, 1975 [JP] Japan .................... 50-79413

[51] Int. Cl.$^3$ .......................... C30B 23/08
[52] U.S. Cl. .................... 156/608; 156/610; 156/DIG. 102; 156/DIG. 64; 156/DIG. 71; 148/175; 427/38
[58] Field of Search ............ 156/610, 600, 602, 608, 156/DIG. 64, 611, 612, 613, 614, DIG. 71, 102; 427/35, 84, 38, 86, 42, 255, 248; 148/175; 264/81; 118/49; 219/175

[56] References Cited
U.S. PATENT DOCUMENTS

| | | | |
|---|---|---|---|
| 2,440,135 | 4/1948 | Alexander | 427/248 R |
| 3,192,892 | 7/1965 | Hanson et al. | 427/38 X |
| 3,281,517 | 10/1966 | Hemmer et al. | 219/275 X |
| 3,370,980 | 2/1968 | Anderson | 156/600 |
| 3,406,040 | 10/1968 | DaSilva et al. | 427/42 |
| 3,598,384 | 8/1971 | Zucchinelli | 219/275 X |
| 3,908,183 | 9/1975 | Ennis, Jr. | 427/38 X |
| 3,912,826 | 10/1975 | Kennedy | 427/38 X |

OTHER PUBLICATIONS

Bis et al., "Thick Epitaxial Films of Phi–xSnxTe", J. of Vacuum Science and Tech. vol. 9 No. 1, pp. 226–230.

*Primary Examiner*—Hiram H. Bernstein
*Attorney, Agent, or Firm*—Oblon, Fisher, Spivak, McClelland & Maier

[57] ABSTRACT

A process for forming a thin single-crystal film comprising the steps of heating and vaporizing a film material in a closed type crucible to form vapor of the film material, injecting the vapor into a high vacuum region to form clusters of atoms of said vapor, ionizing said clusters by bombarding them with electrons to produce ionized clusters, accelerating the ionized clusters onto a cleavage plane of a substrate material to form a high-quality crystal film deposited thereon and oriented according to the crystal axis of the substrate material, and separating the crystal film by dissolving the substrate material in a solvent.

5 Claims, 5 Drawing Figures

PROCESS FOR FORMING A SINGLE-CRYSTAL FILM

The present invention relates to a process for forming a crystal film and more particularly, to a process for forming a thin high-quality single-crystal film.

Generally, it is very difficult to have crystals of various kinds of substances grow on substrates kept at relatively low temperatures, and thus it has not been easy to obtain a thin single-crystal film by means of the conventional vacuum deposition process, vacuum evaporation process or sputtering process, especially in the case of semiconductive elements such as silicon (Si).

Therefore, it is an object of the present invention to eliminate the above-mentioned disadvantages of the conventional crystal-film-forming processes and to provide a novel process for forming a thin high-quality single-crystal film.

It is another object of the present invention to provide a process for forming a thin single-crystal film which is almost free of defects due to impurities.

It is still another object of the present invention to provide a process for forming a thin high-quality single-crystal film, in which a crystal film is excellently formed on a substrate by the self-heating effects of the deposited film and the migration effects of atoms thereof.

It is a further object of the present invention to provide a process for forming a thin single-crystal film, in which the substrate can be made of a wide variety of materials.

It is still a further object of the present invention to provide a thin single-crystal film which can be applied not only to an elemental semiconductor but also to a compound semiconductor.

It is still another object of the present invention to provide a thin single-crystal film, in which the crystal film formed on the substrate can be easily separated therefrom without any change of the crystal morphology.

It is a further object of the present invention to provide a thin single-crystal film which can form a p-n type crystal film or other various multi-layer films.

According to the present invention, there is provided a process for forming a thin single-crystal film which comprises the steps of heating and vaporizing a film material in a closed type crucible with at least one injection nozzle to form vapor of said material, injecting said vapor into a vacuum region the pressure of which is kept at 1/100 or less of the vapor pressure in said crucible and at about $10^{-2}$ Torr or less thereby to form clusters of atoms of said vapor, ionizing said clusters by bombarding the clusters with electrons, accelerating the ionized clusters by a high-voltage electric field onto a cleavage plane of a substrate material easy to cleave and easy to dissolve in various solvents such as water thereby forming a high-quality crystal film deposited thereon and oriented according to the crystal axis of the substrate material, and separating said crystal film by dissolving the substrate material in a solvent.

Now the present invention will be readily understood from the following description in conjunction with the accompanying drawings in which.

Description will be made on an example in which an epitaxial film of silicon is made to grow on a cleavage plane of watersoluble and cleavable rock salt.

Figure 1:
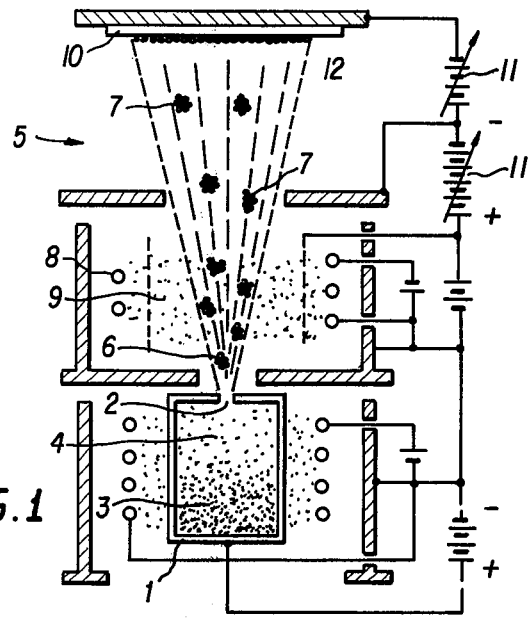
FIG. 1 is a schematical sectional view showing the principle of a preferred embodiment of a deposition device for carrying out the process for forming a crystal film according to the present invention.

Reference is now made to FIG. 1. Reference numeral 1 designates a closed type crucicle with at least one injection nozzle 2. The crucible 1 contains material 3 for forming a crystal film, and is heated up to an elevated temperature using a suitable heating method, for instance, resistance heating or electron bombardment heating (as shown in FIG. 1) thereby vaporizing the material 3 to form vapor 4 so that a vapor pressure of about $10^{-2}$ to several Torrs may be obtained. The vapor 4 thus produced is ejected through the nozzle 2 into a vacuum region 5 the pressure value of which is kept at 1/100 of the vapor pressure in the crucible 1 or less and, in addition, at about $10^{-2}$ Torr or less, where atoms of the vapor 4 are condensed into aggregates 6 (hereinafter referred to as clusters) under the influence of supercooling phenomenon caused by adiabatic expansion. Each of the clusters 6 generally consists of 100 to 2,000 atoms. If one of the atoms of the cluster 6 is ionized, a so-called ionized cluster can be obtained. Accordingly, a filament 8 is provided as a thermion emission source to emit electrons 9 so that they may come into collision with the neutral clusters 6 to produce ionized clusters 7, which are moved towards a substrate 10 together with the neutral clusters 6 while being accelerated by the action of an electric field created by acceleration electrodes provided at and/or near the substrate 10 and connected to an acceleration power source 11 and which are thus made to collide with the substrate 10 to form a deposited layer thereon.

The substrate 10 is preferably made of a substance whose cleavage plane can be easily obtained and which can be easily dissolved in water or other various solvents. Generally, rock salt is suitable for this purpose. Rock salt is particularly suitable for letting silicon crystals grow thereon, since the lattice misfit between rock salt and silicon, that is, the difference between the lattice constant of rock salt and that of silicon is only 3%.

When the ionized clusters 7 come into collision with the substrate 10, most of the kinetic energy thereof is converted into thermal energy which is imparted to the substrate 10 to the deposited surface layer, and simultaneously each ionized cluster 7 itself is disintegrated into individual atomic particles which move on the deposited surface layer to facilitate the growth of a crystal due to the so-called migration effects. Such migration effects can be also expected in the case of the neutral or non-ionized clusters 6. The migration effects, created at an elevated temperature caused by the thermal energy converted from the kinetic energy of the clusters and imparted to the deposited surface layer on the substrate 10, cause to grow a crystal film oriented by the crystal axis of the substrate 10. For instance, a silicon film in the direction of the (100) plane is formed on the (100) plane of rock salt. Thus, a single-crystal film 12 is epitaxially formed on the cleavage plane of the substrate 10 by the ionized clusters 7 and neutral clusters 6 having bombarded the substrate 10.

Then, the substrate 10 with the crystal film 12 thereon is immersed in water. In this manner, the substrate 10 is dissolved in water and thereby the thin single-crystal film 12 can be separated.

Now, reference is made to FIGS. 2 to 5, which show electron micrographs and electron diffraction patterns of thin single-crystal films of silicon deposited on the cleavage plane of rock salt according to the process of the present invention, respectively. In these examples, the acceleration voltage for ionized clusters was 3 kV, and the temperature of the substrate made of rock salt was 300° C. for the example shown in FIGS. 2 and 4 and 500° C. for the example shown in FIGS. 3 and 5.

Figure 2:
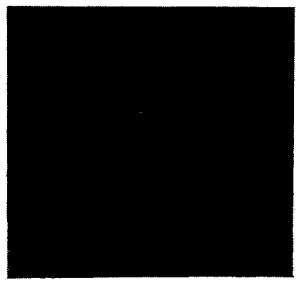
FIGS. 2 to 5 show, by way of example, electron micrographs and electron diffraction patterns of thin crystal films obtained according to the process of the present invention.
Figure 3:
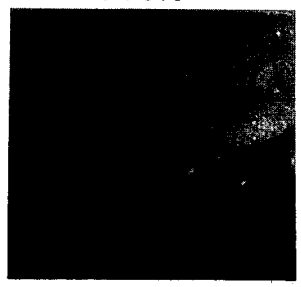
Figure 4:
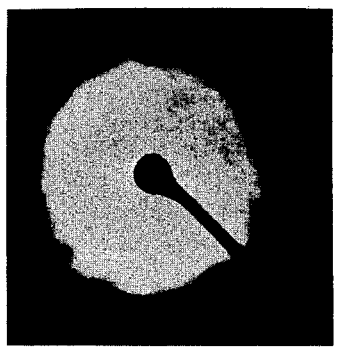
Figure 5:
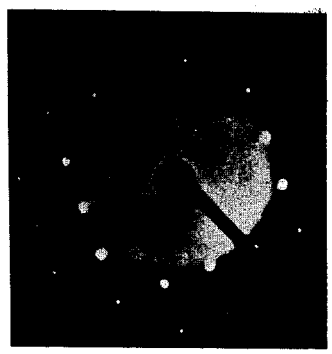

It is understood from FIGS. 2 and 5 that the process of the present invention can easily obtain an excellent crystal film and especially to FIGS. 3 and 5 show a very high-quality single crystal film. In addition, the deposition conditions such as the substrate temperature and the acceleration voltage for ionized clusters may be suitably selected according to the kinds of materials to be deposited as crystal films thereby to easily obtain excellent single-crystal films.

In the process of the present invention, suitable materials such as sodium bromide may be used for forming the substrate, in addition to rock salt. Therefore, the process of the present invention may be applied to formation of single-crystal films of various substances such as elemental semiconductors other than silicon and compound semiconductors.

As is apparent from the foregoing description, the process of the present invention is a novel and excellent technique which includes the steps of forming ionized clusters of a material to be formed as a crystal film and accelerating the ionized clusters to make them collide with a substrate to form a deposited film thereon, and therefore it has the following excellent features and effects:

(1) The surface of a substrate on which a crystal film is to be deposited and formed can be at all times kept clean because of the sputter-cleaning action of ionized clusters even during deposition, and therefore a high-quality single-crystal film having almost no defects due to impurities can be obtained.

(2) Since the ionized clusters are accelerated with a suitable high energy given by a high-voltage electric field applied, the energy is partially converted into heat when the ionized clusters impinge upon the substrate, and thereby the heat causes a local temperature rise with the consequent result that the crystal growth of the deposited material is smoothly carried out. In this case, it is not necessarily required that the substrate itself is heated; and a good quality crystal film can smoothly grow by the self-heating effects of the deposited surface alone. Furthermore, a combined use of a proper increase in the kinetic energy of ionized clusters and a suitable external heating of the substrate will result in an increase in single-crystal area thereby facilitating the growth of a single-crystal film.

(3) Since the ionized cluster are small in charge-mass ratio (e/m), a crystal film can easily grow on an insulating substrate. Therefore, the substrate which orients the crystal axis of a film deposited thereon can be made of a wide variety of materials including rock salt.

(4) By properly selecting a substrate made of material very similar in lattice constant to that of a film to be deposited, this invention can be applied not only to an elemental semiconductor but also to a compound semiconductor.

(5) A crystal film deposited on the substrate can be easily separated therefrom by using water or other various solvents without changing the crystal morphology.

(6) By repeating the above-mentioned deposition process, a p-n type crystal film or other multi-layer crystal films can be formed.

What is claimed is:

1. A process for forming a thin single-crystal film comrising the steps of:
   heating and vaporizing a film material in a closed type crucible with at least one injection nozzle to form vapor of said material;
   injecting said vapor through said injection nozzle into a vacuum region the pressure of which is kept at 1/100 or less of the vapor pressure in said crucible and at about $10^{-2}$ Torr or less to adiabatically expand said vapor so as to attain a supercooled state and form clusters comprising atoms of said vapor;
   ionizing at least one atom forming said clusters by bombarding said clusters with electrons to produce ionized clusters;
   accelerating said ionized clusters by means of an electric field;
   permitting said accelerated clusters to collide with a cleavage plane of a substrate material easy to cleave and easy to dissolve in a solvent thereby forming a high-quality crystal film deposited thereon and oriented according to the crystal axis of said substrate material; and
   separating said crystal film by dissolving said substrate material in said solvent.

2. A process for forming a thin single-crystal film as in claim 1 wherein said film material is silicon.

3. A process for forming a thin single-crystal film as in claim 1 wherein said substrate material is rock salt.

4. A process for forming a thin single-crystal film as in claim 1 wherein said substrate is sodium bromide.

5. A process for forming a thin single-crystal film as in claim 2 wherein said solvent is water.

* * * * *